(12) United States Patent
Jung et al.

(10) Patent No.: US 9,219,245 B2
(45) Date of Patent: Dec. 22, 2015

(54) ORGANIC LIGHT EMITTING DIODE DISPLAY AND MANUFACTURING METHOD THEREOF

(75) Inventors: Hae-Goo Jung, Yongin (KR); Jae-Hyuk Lee, Yongin (KR); Seung-Yo Yang, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 50 days.

(21) Appl. No.: 13/612,303

(22) Filed: Sep. 12, 2012

(65) Prior Publication Data

US 2013/0126874 A1 May 23, 2013

(30) Foreign Application Priority Data

Nov. 18, 2011 (KR) .......... 10-2011-0120908
Jan. 10, 2012 (KR) .......... 10-2012-0003035

(51) Int. Cl.
*H01L 51/52* (2006.01)

(52) U.S. Cl.
CPC .......... *H01L 51/5243* (2013.01); *H01L 51/524* (2013.01); *H01L 51/5259* (2013.01); *H01L 51/5281* (2013.01)

(58) Field of Classification Search
CPC .............. H01L 21/50; H01L 21/67376; H01L 23/3142; H01L 51/5243; H01L 51/524
USPC .................................................. 257/59, 710
See application file for complete search history.

(56) References Cited

U.S. PATENT DOCUMENTS

| | | | |
|---|---|---|---|
| 6,822,391 B2 * | 11/2004 | Yamazaki et al. | 313/512 |
| 7,990,059 B2 * | 8/2011 | Matsudate et al. | 313/512 |
| 8,674,345 B2 * | 3/2014 | Lee | 257/40 |
| 2010/0230664 A1 * | 9/2010 | Yamazaki et al. | 257/40 |
| 2011/0148784 A1 * | 6/2011 | Lee | 345/173 |
| 2012/0050075 A1 * | 3/2012 | Salmon | 341/20 |
| 2013/0076268 A1 * | 3/2013 | Choi et al. | 315/312 |

FOREIGN PATENT DOCUMENTS

| | | |
|---|---|---|
| EP | 2363905 A1 * | 9/2011 |
| KR | 100622251 | 9/2006 |
| KR | 100626087 | 9/2006 |
| KR | 1020110092582 | 8/2011 |
| KR | 1020110114325 | 10/2011 |

* cited by examiner

*Primary Examiner* — William Coleman
(74) *Attorney, Agent, or Firm* — Robert E. Bushnell, Esq.

(57) ABSTRACT

An organic light emitting diode (OLED) display comprises: a thin film transistor substrate including an organic light emitting element; and a sealing substrate attached to the thin film transistor substrate, thereby sealing the thin film transistor substrate. The sealing substrate has a folded portion enclosing a side surface and a bottom surface of an edge portion of the thin film transistor substrate.

28 Claims, 10 Drawing Sheets

ORGANIC LIGHT EMITTING DIODE DISPLAY AND MANUFACTURING METHOD THEREOF

CLAIM OF PRIORITY

This application makes reference to, incorporates the same herein, and claims all the benefits accruing under 35 U.S.C. §119 from two applications earlier filed in the Korean Intellectual Property Office (KIPO) on 18 Nov. 2011 and 10 Jan. 2012, respectively, and there duly assigned Serial Nos. 10-2011-0120908 and 10-2012-0003035, respectively.

BACKGROUND OF THE INVENTION

1. Field of the Invention

The present invention relates generally to an organic light emitting diode (OLED) display and a manufacturing method thereof. More particularly, the present invention relates to an organic light emitting diode (OLED) display including a sealing substrate for sealing a display unit, and a manufacturing method thereof.

2. Description of the Related Art

An organic light emitting diode (OLED) display is a self-emissive display that displays an image with a self-emissive organic light emitting element. If a thin film transistor substrate including a plurality of organic light emitting elements is exposed to moisture or oxygen, a function thereof is deteriorated. Therefore, the thin film transistor substrate is sealed by using a sealing substrate, thereby suppressing penetration of the external moisture and oxygen.

As the sealing substrate, a glass sealing substrate and a metal sheet sealing substrate are used. The glass sealing substrate seals the thin film transistor substrate by using glass, and the metal sheet sealing substrate seals the thin film transistor substrate by combining a metal sheet, instead of the glass, with an entire surface of the thin film transistor substrate.

However, when using a separate glass sealing substrate, in addition to the glass substrate, as a supporting substrate of the thin film transistor substrate, it is disadvantageous from the standpoint of cost. Also, the metal sheet sealing substrate is combined with the entire surface of the thin film transistor substrate so that the organic light emitting diode (OLED) display may be bent due to a thermal expansion coefficient difference between the metal sheet sealing substrate and the glass substrate of the thin film transistor substrate.

When the organic light emitting diode (OLED) display is bent, a misalignment or a reliability of the organic light emitting diode (OLED) display may be generated in a TAB IC bonding process and a silicon dispenser.

The above information disclosed in this Background section is only for enhancement of an understanding of the background of the described technology, and therefore it may contain information that does not form the prior art that is already known in this country to a person of ordinary skill in the art.

SUMMARY OF THE INVENTION

The present invention provides an organic light emitting diode (OLED) display preventing deformation thereof, and a manufacturing method thereof.

An organic light emitting diode (OLED) display according to an exemplary embodiment includes: a thin film transistor substrate including an organic light emitting element; and a sealing substrate attached to the thin film transistor substrate, thereby sealing the thin film transistor substrate. The sealing substrate has a folded portion enclosing a side surface and a bottom surface of an edge portion of the thin film transistor substrate.

The folded portion may include a short edge folded portion enclosing a pair of short edge portions of the thin film transistor substrate.

The short edge folded portion may include a short edge side surface folded portion contacting a side surface of a short edge portion of the thin film transistor substrate, and a short edge bottom surface folded portion contacting a neighboring bottom surface adjacent to a side surface of a short edge portion of the thin film transistor substrate.

A sealant may be interposed between the folded portion and the thin film transistor substrate.

A filler may be formed between the sealing substrate and the thin film transistor substrate.

A moisture absorbing member may be formed between the sealant and the filler.

The folded portion may include a long edge folded portion enclosing a long edge portion of the thin film transistor substrate.

The long edge folded portion may include a long edge side surface folded portion contacting a side surface of a long edge portion of the thin film transistor substrate, and a long edge bottom surface folded portion contacting a neighboring bottom surface adjacent to a side surface of a long edge portion of the thin film transistor substrate.

The bottom surface of the thin film transistor substrate may include a bottom surface groove, a portion of which is adjacent to the side surface of the edge portion of the thin film transistor substrate and is etched, and the folded portion may enclose the bottom surface groove.

The folded portion may include a side surface folded portion enclosing the side surface of the edge portion of the thin film transistor substrate, and a bottom surface folded portion inserted into a bottom surface groove of an edge portion of the thin film transistor substrate. A sealant may be interposed between the bottom surface groove and the bottom surface folded portion.

Heights of the outside surface of the bottom surface folded portion and the bottom surface of the thin film transistor substrate may correspond to each other.

A polarizing plate may simultaneously cover an outside surface of the bottom surface folded portion and a bottom surface of the thin film transistor substrate.

The folded portion may include a long edge folded portion enclosing a long edge portion of the thin film transistor substrate and a short edge folded portion enclosing a short edge portion of the thin film transistor substrate.

The sealing substrate may include a metal sheet.

A manufacturing method of an organic light emitting diode (OLED) display according to an exemplary embodiment includes: coating a sealant on a side surface of an edge portion of a thin film transistor substrate including an organic light emitting element and a neighboring bottom surface neighboring the side surface; adhering a sealing substrate to the surface of the thin film transistor substrate; and folded the edge portion of the sealing substrate to form a folded portion of the sealing substrate enclosing the side surface and the bottom surface of the edge portion of the thin film transistor substrate.

In the forming of the folded portion of the sealing substrate, a short edge folded portion enclosing a pair of short edge portions of the thin film transistor substrate may be formed.

The method may further include hardening the sealant interposed between the short edge folded portion and the side surface and the neighboring bottom surface of the edge portion of the thin film transistor substrate.

In the forming of the folded portion of the sealing substrate, a long edge folded portion enclosing a pair of long edge portions of the thin film transistor substrate may be formed.

The method may further include hardening the sealant interposed between the long edge folded portion and the side surface and the neighboring bottom surface of the edge portion of the thin film transistor substrate.

The method may further include coating the sealant on the side surface of the edge portion of the thin film transistor substrate and the neighboring bottom surface adjacent to the side surface, etching the bottom surface adjacent to the side surface of the edge portion of the thin film transistor substrate to form the bottom surface groove, and coating the sealant on the side surface and the bottom surface groove of the edge portion of the thin film transistor substrate.

The folded portion may include a side surface folded portion enclosing the side surface of the edge portion of the thin film transistor substrate and a bottom surface folded portion inserted into the bottom surface groove of the edge portion of the thin film transistor substrate, and the method may further include hardening the sealant interposed between the side surface folded portion and the side surface of the edge portion of the thin film transistor substrate, and interposed between the bottom surface folded portion and the bottom surface groove.

The heights of the outside surface of the bottom surface folded portion and the bottom surface of the thin film transistor substrate may correspond to each other.

The method may further include attaching a polarizing plate on the outside surface of the bottom surface folded portion and the bottom surface of the thin film transistor substrate.

The sealing substrate may include a metal sheet. The length of the long edge portion of the sealing substrate may be longer than the length of the long edge portion of the thin film transistor substrate.

The length of the short edge portion of the sealing substrate may be longer than the length of the short edge portion of the thin film transistor substrate.

A portion where the long edge folded portion and the short edge folded portion overlap each other may be removed.

The corners of the long edge folded portion and the short edge folded portion may be chamfered.

The sealing substrate of the organic light emitting diode (OLED) display according to an exemplary embodiment includes the folded portion enclosing the side surface and the neighboring bottom surface of the edge of the thin film transistor substrate so that the bending, due to the difference of the thermal expansion coefficient between the sealing substrate made of the metal sheet and the supporting substrate of the thin film transistor substrate made of the glass, may be minimized.

Also, the bottom surface groove is formed at the edge portion of the thin film transistor substrate, and the sealing substrate has the folded portion inserted into the side surface and the bottom surface groove of the edge portion of the thin film transistor substrate so that the polarizing plate may be flatly attached to the bottom surface of the thin film transistor substrate and the outside surface of the short edge bottom surface folded portion without the step. As a result, the light leakage is not generated and deterioration of the display quality may be prevented.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
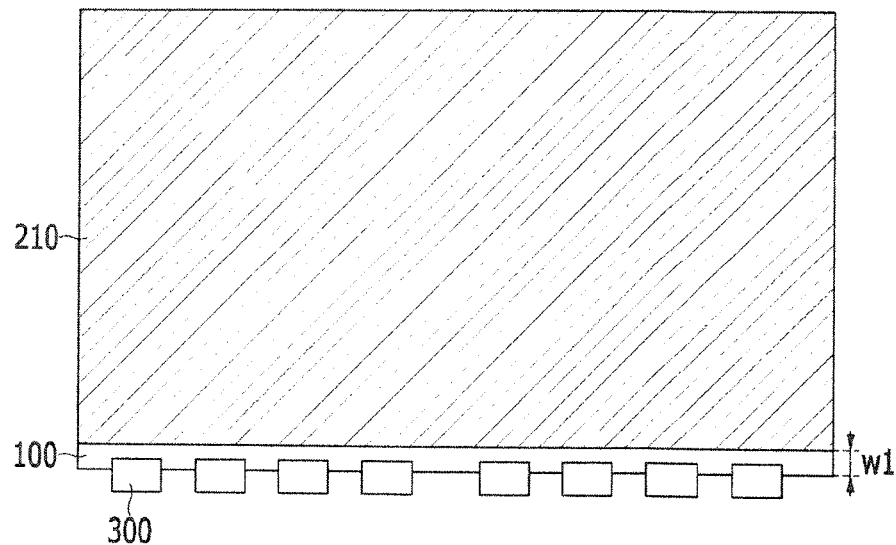
FIG. 1 is a top plan view of an organic light emitting diode (OLED) display according to a first exemplary embodiment of the invention.

The present invention will be described more fully hereinafter with reference to the accompanying drawings, in which exemplary embodiments of the invention are shown. As those skilled in the art will realize, the described embodiments may be modified in various different ways, all without departing from the spirit or scope of the present invention.

The drawings and description are to be regarded as illustrative in nature and not restrictive. Like reference numerals designate like elements throughout the specification. The size and thickness of the components shown the drawings are optionally determined for better understanding and ease of description, and the present invention is not limited to the examples shown in the drawings.

It will be understood that, when an element such as a layer, film, region, or substrate is referred to as being "on" another element, it can be directly on the other element or intervening elements may also be present.

Figure 2:
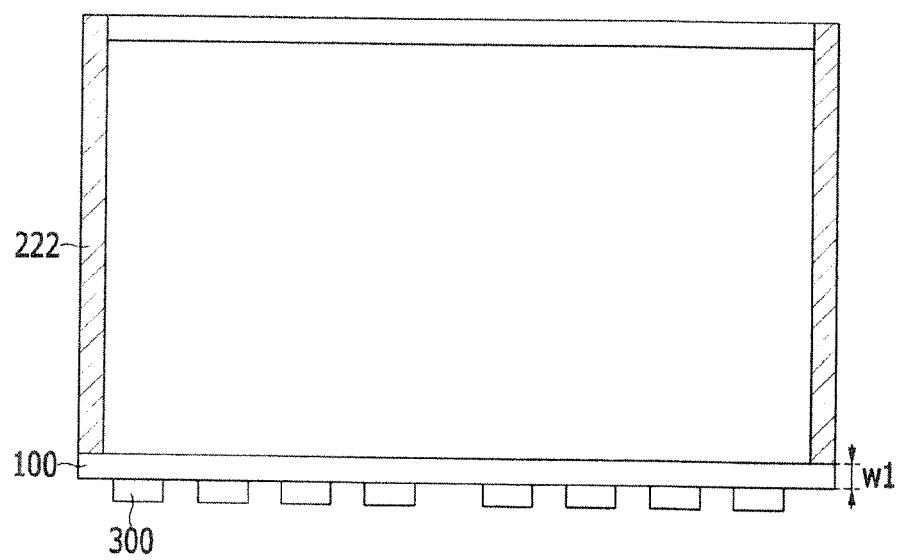
FIG. 2 is a rear view of an organic light emitting diode (OLED) display according to the first exemplary embodiment.
Figure 3:
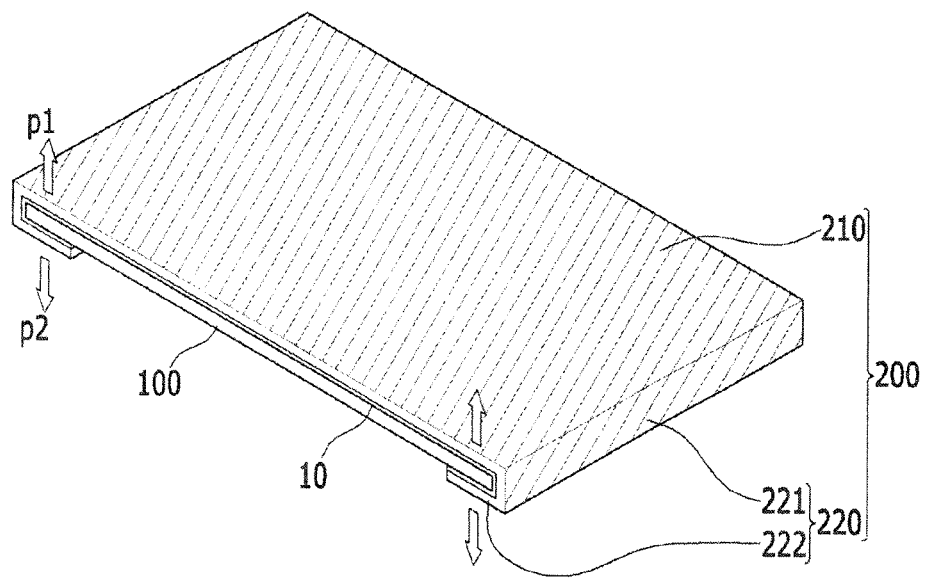
FIG. 3 is a perspective view of an organic light emitting diode (OLED) display according to the first exemplary embodiment.
Figure 6:
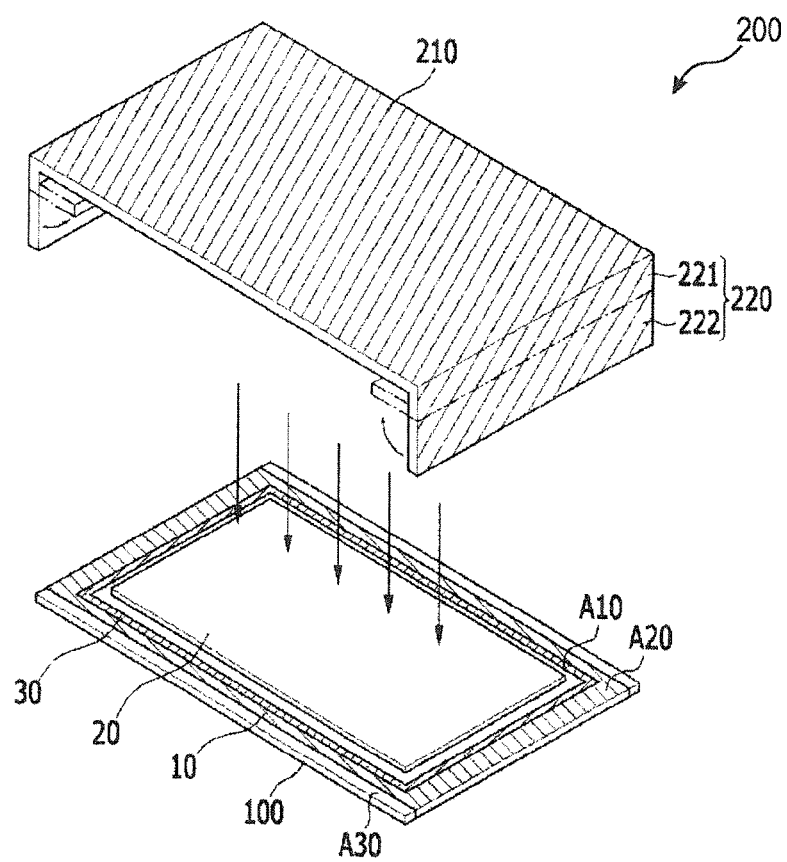
FIG. 6 is a view of a state in which a folded portion of a sealing substrate of an organic light emitting diode (OLED) display according to the first exemplary embodiment is folded and then attached to a thin film transistor substrate.

FIG. 1 is a top plan view of an organic light emitting diode (OLED) display according to a first exemplary embodiment of the invention, FIG. 2 is a rear view of an organic light emitting diode (OLED) display according to the first exemplary embodiment, FIG. 3 is a perspective view of an organic light emitting diode (OLED) display according to the first exemplary embodiment, and FIG. 6 is a view of a state in which a folded portion of a sealing substrate of an organic light emitting diode (OLED) display according to the first exemplary embodiment is folded and then attached to a thin film transistor substrate 100.

As shown in FIG. 1 to FIG. 3, an organic light emitting diode (OLED) display according to the first exemplary embodiment includes a thin film transistor substrate 100 formed with an organic light emitting element and a sealing substrate 200 attached to the thin film transistor substrate 100 so as to seal the thin film transistor substrate 100.

As shown in FIG. 6, the thin film transistor substrate 100 includes a display area A10 for displaying images and a non-display area surrounding the display area A10. The non-display area may be divided into a wire and sealing region A20 and a pad region A30. The sealing substrate 200 has a size that covers the display area A10 and the sealing region A20 of the thin film transistor substrate 100. Accordingly, the pad region A30 of the thin film transistor substrate 100 does not overlap the sealing substrate 200, and is exposed to the outside by a predetermined width w1 (see FIGS. 1 and 2).

The display area A10 of FIG. 6 includes an organic light emitting element and a driving circuit unit for each pixel. The organic light emitting element includes a pixel electrode, an organic emission layer, and a common electrode. The driving circuit unit includes at least two thin film transistors including a switching thin film transistor and a driving thin film transistor, and at least one capacitor. The organic emission layer includes a hole injection layer (HIL), a hole transport layer (HTL), an emission layer, an electron transport layer (ETL), and an electron injection layer (EIL) sequentially deposited from the pixel electrode. Holes and electrons are injected into the organic emission layer from the pixel electrode and the common cathode, and emission of light from the organic emission layer occurs when the excitons, being combinations of the injected holes and electrodes, drop from an excited state to a ground state.

Also, a gate line, a data line, and a common power source line are positioned for each pixel. The gate line transmits a scan signal and the data line transmits a data signal. The common power source line applies a common voltage to the driving thin film transistor.

The sealing region A20 is positioned with the sealant 10 enclosing the display area A10, and the sealant 10 does not include a conducting material but may include a thermal hardening resin, for example, an epoxy resin. A moisture absorbing member 30 and a filler 20 are sequentially positioned between the thin film transistor substrate 100 and the sealing substrate 200 inside the sealant 10.

The moisture absorbing member 30 is disposed to absorb moisture flowing in from the outside, and the filler 20 covers the display area A10 to protect the display area A10 from an external impact.

The pad region A30 is formed at any one long edge portion of the thin film transistor substrate 100, and the pad region A30 is attached to a flexible printing circuit 300 of FIGS. 1 and 2, such as a plurality of TAB ICs. The flexible printing circuit 300 applies a corresponding electrical signal to the common power source line, the common electrode, etc.

Referring to FIG. 3, the sealing substrate 200 is fixed to the thin film transistor substrate 100 by the sealant 10. The sealing substrate 200 may be made of a metal sheet having low resistance and an excellent prevention effect against the moisture and oxygen such as an aluminum sheet, an aluminum alloy sheet, a copper sheet, or a copper alloy sheet. The sealing substrate 200 completely covers and protects the display area A10 of the thin film transistor substrate 100 and prevents the penetration of the moisture and oxygen from the outside.

The sealing substrate 200 includes a connection portion 210 attached to the display area of the thin film transistor substrate 100 and a folded portion enclosing a side surface and a bottom surface of an edge portion of the thin film transistor substrate 100.

The folded portion includes a short edge folded portion 220 enclosing a pair of short edge portions of the thin film transistor substrate 100. The short edge folded portion 220 includes a short edge side surface folded portion 221 contacting the side surface of the short edge portion of the thin film transistor substrate 100, and a short edge bottom surface folded portion 222 contacting the neighboring bottom surface adjacent to the side surface of the short edge portion of the thin film transistor substrate 100.

The sealant 10 is interposed between the short edge folded portion 220 and the thin film transistor substrate 100. Accordingly, the short edge side surface folded portion 221 and the short edge bottom surface folded portion 222 contact the side surface and the neighboring bottom surface, respectively, of the short edge portion of the thin film transistor substrate 100 by hardening of the sealant 10.

The supporting substrate of the thin film transistor substrate 100 may be made of transparent glass or a transparent polymer resin. The supporting substrate of the transparent polymer resin material may include one of polyether sulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

A plurality of processes for forming a plurality of pixels on the thin film transistor substrate 100 proceed and heat is applied during the processes so that the thin film transistor substrate 100 is expanded by the heat. For example, the sealant 10 is hardened at a high temperature so that the thin film transistor substrate 100 is expanded by a thermal expansion coefficient difference between the two substrates 100 and 200 when combining the thin film transistor substrate 100 and the sealing substrate 200, and at this time, the short edge portion of the thin film transistor substrate 100 is bent in an upper direction p1. Accordingly, the expansion of the thin film transistor substrate 100 decreases the durability of the organic light emitting diode (OLED) display and the accuracy of the display area A10.

However, in the first exemplary embodiment, the short edge folded portion 220 encloses a pair of short edge portions of the thin film transistor substrate 100 so that the short edge folded portion 220 pulls the short edge portion of the thin film transistor substrate 100 in the lower direction p2.

That is, the force pulling the thin film transistor substrate 100 by the connection portion 210 of the sealing substrate 200 in the upper direction p1 is negated by the force of the opposite direction by the short edge bottom surface folded portion 222 of the sealing substrate 200 so that bending of the organic light emitting diode (OLED) display is prevented.

Accordingly, bending due to the difference between the thermal expansion coefficients of the sealing substrate 200 made of the metal sheet and the supporting substrate of the thin film transistor substrate 100 made of the glass may be minimized.

Referring to FIG. 6, the filler 20 formed between the connection portion 210 of the sealing substrate 200 and the thin film transistor substrate 100 protects the thin film transistor substrate 100 from an external impact, and the moisture absorbing member 30 formed between the filler 20 and the sealant 10 prevents the external moisture and oxygen from flowing into the pixel.

Figure 4:
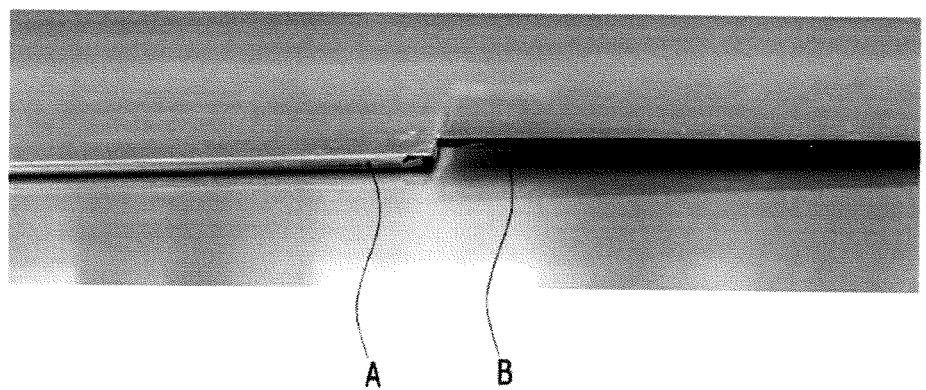
FIG. 4 is a photo showing a degree of bending of an organic light emitting diode (OLED) display according to the first exemplary embodiment and a comparative example.

FIG. 4 is a photo showing a degree of bending of an organic light emitting diode (OLED) display according to the first exemplary embodiment and a comparative example.

FIG. 4 shows the degree of bending of the exemplary embodiment (A) while attaching and hardening the sealing substrate 200 of FIG. 6 having a longer length than the supporting substrate of the thin film transistor display panel 100 by 20 mm in up/down and right/left directions, and a comparative example (B) while attaching and hardening the sealing substrate 200 having the same size as the supporting substrate of the thin film transistor display panel 100.

As shown in FIG. 4, in the case of the comparative example (B), a bend of about 3 mm is generated. However, in the case of the exemplary embodiment (A), a bend of about 1 mm is generated, and accordingly the organic light emitting diode (OLED) display according to the first exemplary embodiment may minimize the bending.

A manufacturing method of an organic light emitting diode (OLED) display according to the first exemplary embodiment will be described with reference to FIG. 5 and FIG. 6.

Figure 5:
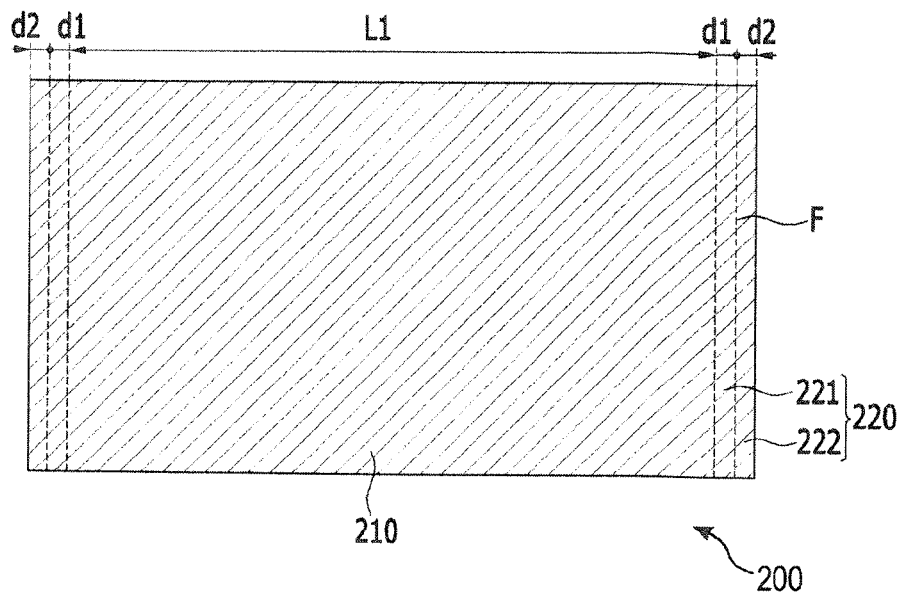
FIG. 5 is a view of a state of a sealing substrate of an organic light emitting diode (OLED) display according to the first exemplary embodiment before being folded.

FIG. 5 is a view of a state of a sealing substrate of an organic light emitting diode (OLED) display according to the first exemplary embodiment before being folded, and FIG. 6 is a view of a state that a folded portion of a sealing substrate of an organic light emitting diode (OLED) display according to the first exemplary embodiment is folded and then attached to a thin film transistor substrate 100.

As shown in FIG. 5, a sealing substrate 200 having a long edge portion that is longer than a length L1 of a long edge portion of the thin film transistor substrate 100 of FIG. 6 is prepared.

Also, a folding line F is formed according to a pair of short edge portions of the sealing substrate 200. That is, the folding line F allows the short edge side surface folded portion 221 contacting the side surface of the short edge portion of the thin film transistor substrate 100 and the short edge bottom surface folded portion 222 contacting the neighboring bottom surface of the short edge portion of the thin film transistor substrate 100 to easily contact. This folding line may be formed as a groove through an etching or pressing process.

Next, as shown in FIG. 6, the sealant 10 is coated on the side surface of the short edge portion of the thin film transistor substrate 100 formed with the organic light emitting element and the neighboring bottom surface adjacent to the side surface.

Also, the sealing substrate 200 is attached to the surface of the thin film transistor substrate 100. Also, the short edge folded portion 220 of the sealing substrate 200 is folded to enclose the side surface and the bottom surface of the short edge portion of the thin film transistor substrate 100.

Next, as shown in FIG. 3, the sealant 10 is hardened so as to adhere the short edge side surface folded portion 221 and the short edge bottom surface folded portion 222 to the side surface and the neighboring bottom surface of the short edge portion of the thin film transistor substrate 100. Accordingly, the short edge folded portion 220 pulls the short edge portion of the thin film transistor substrate 100 in the lower direction p2 so that the force with which the connection portion 210 of the sealing substrate 200 acts against the force that the short edge bottom surface folded portion 222 of the sealing substrate 200 pulls the thin film transistor substrate 100 in the opposite direction, thereby preventing the bending of the organic light emitting diode (OLED) display.

Meanwhile, in the first exemplary embodiment, the short edge folded portion is formed at the sealing substrate, but a second exemplary embodiment of forming the long edge folded portion at the sealing substrate is possible.

Next, the second exemplary embodiment will be described with reference to FIG. 7 to FIG. 10.

Figure 7:
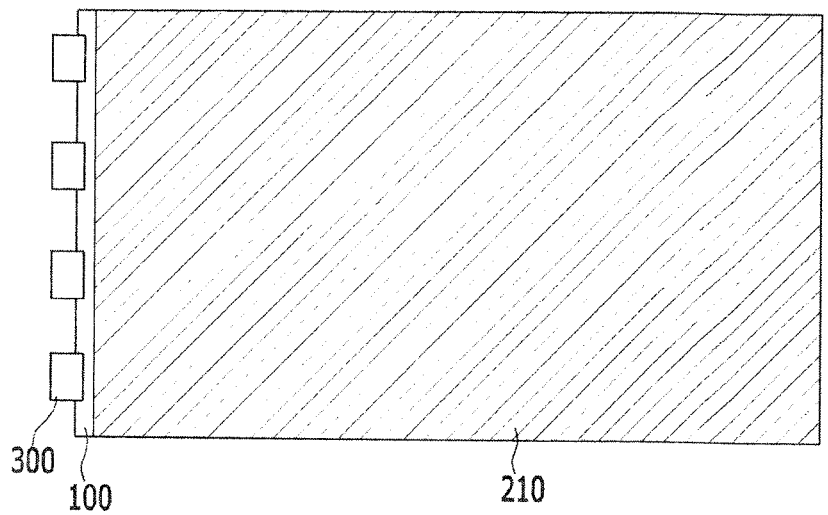
FIG. 7 is a top plan view of an organic light emitting diode (OLED) display according to a second exemplary embodiment of the invention.
Figure 8:
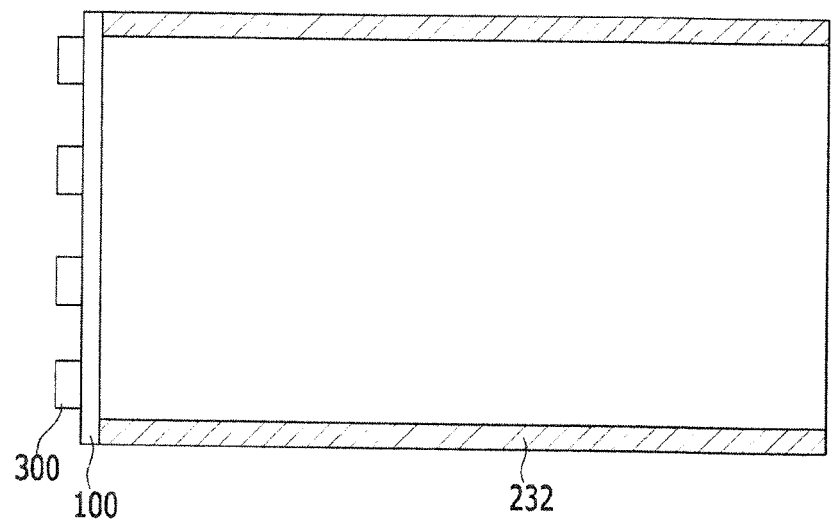
FIG. 8 is a rear view of an organic light emitting diode (OLED) display according to the second exemplary embodiment.
Figure 9:
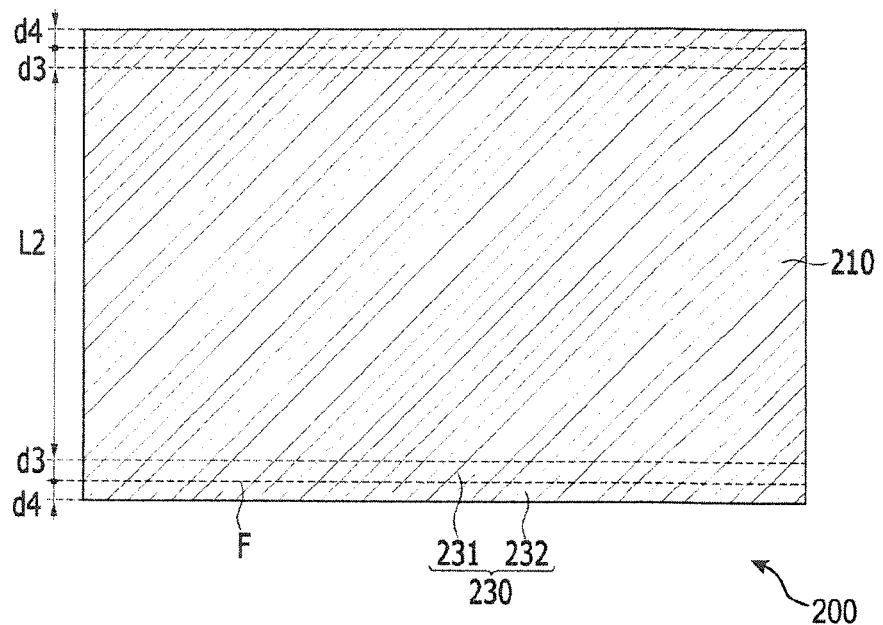
FIG. 9 is a view of a state of a sealing substrate of an organic light emitting diode (OLED) display according to the second exemplary embodiment before being folded.
Figure 10:
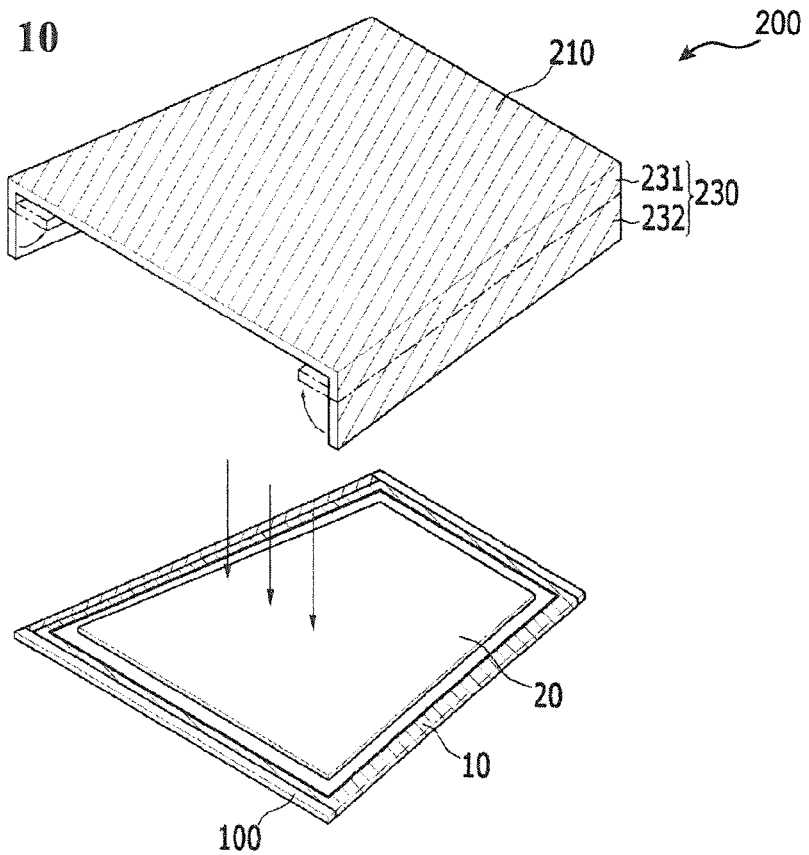
FIG. 10 is a view of a state in which a folded portion of a sealing substrate of an organic light emitting diode (OLED) display according to the first exemplary embodiment is folded and then attached to a thin film transistor substrate.

FIG. 7 is a top plan view of an organic light emitting diode (OLED) display according to a second exemplary embodiment of the invention, FIG. 8 is a rear view of an organic light emitting diode (OLED) display according to the second exemplary embodiment, FIG. 9 is a view of a state of a sealing substrate of an organic light emitting diode (OLED) display according to the second exemplary embodiment before being folded, and FIG. 10 is a view of a state in which a folded portion of a sealing substrate of an organic light emitting diode (OLED) display according to the first exemplary embodiment is folded and then attached to a thin film transistor substrate 100.

The second exemplary embodiment shown in FIG. 7 to FIG. 10 is substantially equivalent to the first exemplary embodiment shown in FIG. 1 to FIG. 3 except that the long edge folded portion is formed in the sealing substrate so that no repeated description will be provided As shown in FIG. 7 to FIG. 10, the sealing substrate 200 of the organic light emitting diode (OLED) display according to the second exemplary embodiment includes a connection portion 210 attached to the display area of the thin film transistor substrate 100 and the folded portion enclosing the side surface and the bottom surface of the edge portion of the thin film transistor substrate 100. Referring to FIGS. 9 and 10, the folded portion includes a long edge folded portion 230 enclosing a pair of long edge portions of the thin film transistor substrate 100. The long edge folded portion 230 includes a long edge side surface folded portion 231 contacting the side surface of the long edge portion of the thin film transistor substrate 100 and a long edge bottom surface folded portion 232 contacting the neighboring bottom surface adjacent to the side surface of the long edge portion of the thin film transistor substrate 100.

A sealant 10 (FIG. 10) is interposed between the long edge folded portion 230 and the thin film transistor substrate 100. Accordingly, by the hardening of the sealant 10, the long edge side surface folded portion 231 and the long edge bottom surface folded portion 232 are adhered to the side surface and the neighboring bottom surface, respectively, of the long edge portion of the thin film transistor substrate 100.

The long edge folded portion 230 encloses a pair of long edge portions of the thin film transistor substrate 100 so that the long edge folded portion 230 pulls the long edge portion of the thin film transistor substrate 100 in the lower direction p2. As described above, the long edge bottom surface folded portion 232 of the sealing substrate 200 pulls against force that the connection portion 210 of the sealing substrate 200 pulls the thin film transistor substrate 100 in the upper direction p1 through the force of the opposite direction such that the bending of the organic light emitting diode (OLED) display is prevented.

A manufacturing method of an organic light emitting diode (OLED) display according to the second exemplary embodiment will be described with reference to FIG. 9 and FIG. 10.

As shown in FIG. 9, a sealing substrate 200 having a short edge portion that is longer than the length L2 of the short edge portion of the thin film transistor substrate 100 is prepared.

Also, a folding line F is previously formed at a pair of long edge portions of the sealing substrate 200. That is, the long edge side surface folded portion 231 contacting the side surface of the long edge portion of the thin film transistor substrate 100 and the long edge bottom surface folded portion 232 contacting the neighboring bottom surface of the long edge portion of the thin film transistor substrate 100 may be easily folded by forming the folding line. This folding line may be formed as a groove through an etching or pressing process.

Next, as shown in FIG. 10, the sealant 10 is coated on the side surface of the long edge portion of the thin film transistor substrate 100 formed with the organic light emitting element and the neighboring bottom surface adjacent to the side surface.

Also, the sealing substrate 200 is attached to the surface of the thin film transistor substrate 100. Furthermore, the long edge folded portion 230 of the sealing substrate 200 is folded thereby enclosing the side surface and the bottom surface of the long edge portion of the thin film transistor substrate 100.

Also, the sealant 10 is hardened so that the long edge side surface folded portion 231 and the long edge bottom surface folded portion 232 are adhered to the side surface and the neighboring bottom surface, respectively, of the long edge portion of the thin film transistor substrate 100. Accordingly, the long edge folded portion 230 pulls the long edge portion of the thin film transistor substrate 100 in the lower direction p2 such that the long edge bottom surface folded portion 232 of the sealing substrate 200 pulls against the force that the connection portion 210 of the sealing substrate 200 pulls the thin film transistor substrate 100 through the force of the opposite direction, thereby preventing the bending of the organic light emitting diode (OLED) display.

Meanwhile, in the first exemplary embodiment of FIG. 3, the short edge folded portion 220 is only formed in the sealing substrate 200. However, in the third exemplary embodiment, forming of the short edge folded portion and the long edge folded portion at the sealing substrate is possible.

Next, the third exemplary embodiment will be described with reference to FIG. 11 to FIG. 13.

Figure 11:
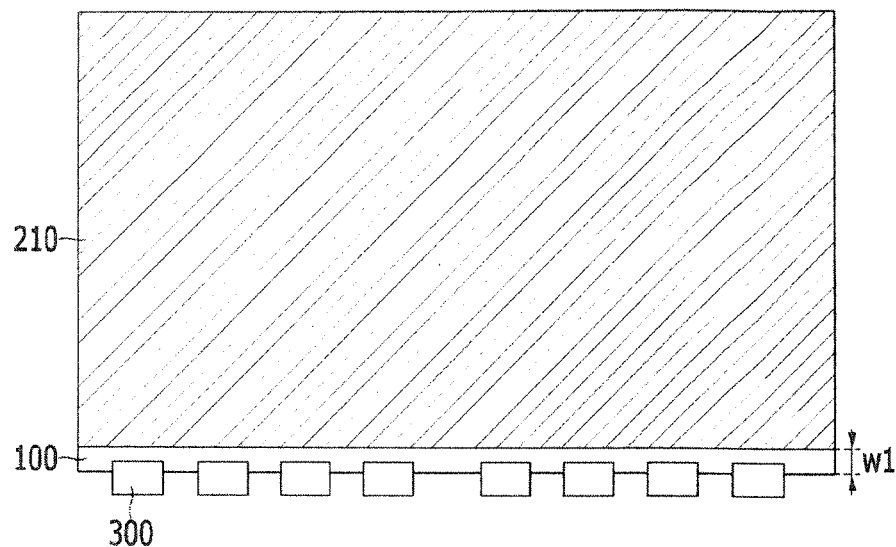
FIG. 11 is a top plan view of an organic light emitting diode (OLED) display according to a third exemplary embodiment of the invention.
Figure 12:
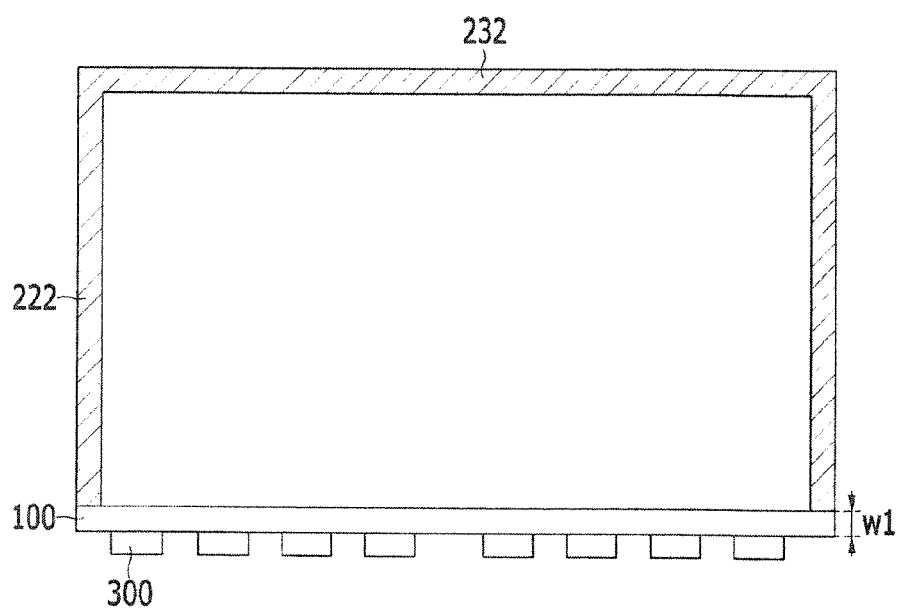
FIG. 12 is a rear view of an organic light emitting diode (OLED) display according to the third exemplary embodiment.
Figure 13:
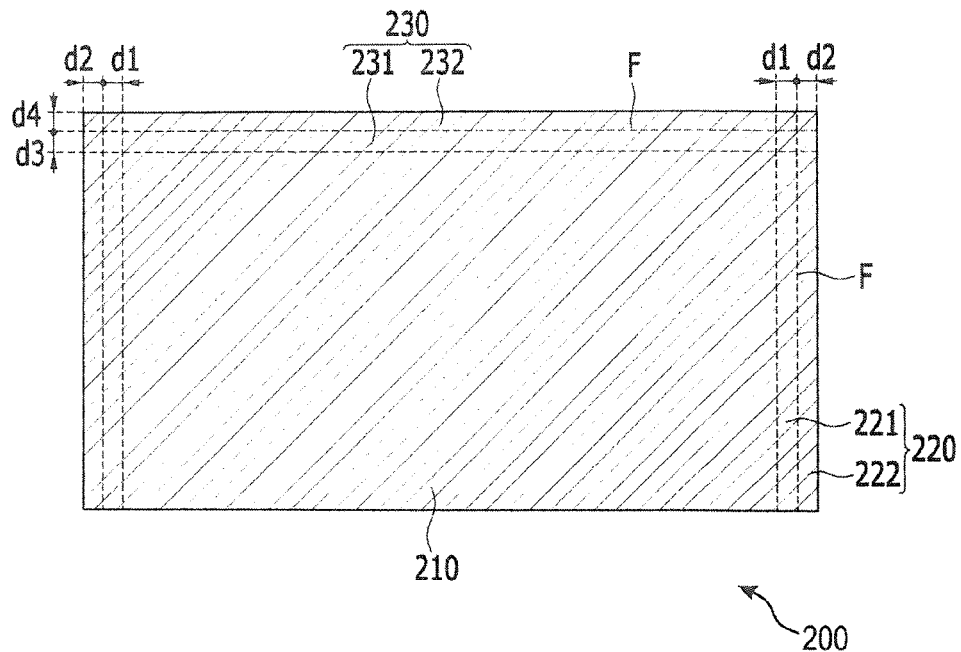
FIG. 13 is a view of a state of a sealing substrate of an organic light emitting diode (OLED) display according to the third exemplary embodiment before being folded.
Figure 14:
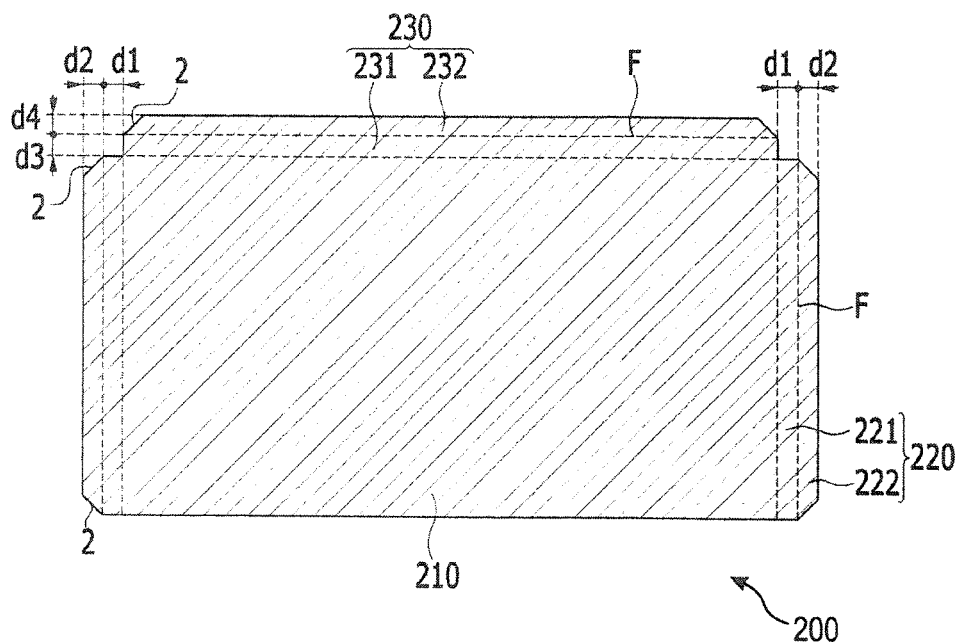
FIG. 14 is a view of another exemplary embodiment for a state of a sealing substrate of an organic light emitting diode (OLED) display according to the third exemplary embodiment before being folded.

FIG. 11 is a top plan view of an organic light emitting diode (OLED) display according to a third exemplary embodiment of the invention, FIG. 12 is a rear view of an organic light emitting diode (OLED) display according to the third exemplary embodiment, FIG. 13 is a view of a state of a sealing substrate of an organic light emitting diode (OLED) display according to the third exemplary embodiment before being folded, and FIG. 14 is a view of another exemplary embodiment for a state of a sealing substrate of an organic light emitting diode (OLED) display according to the third exemplary embodiment before being folded.

The third exemplary embodiment shown in FIG. 11 to FIG. 14 is substantially equivalent to the first exemplary embodiment shown in FIG. 1 to FIG. 3 except for the long edge folded portion further formed in the sealing substrate, so that the overlapping description is omitted.

As shown in FIG. 11 to FIG. 13, the sealing substrate 200 of the organic light emitting diode (OLED) display according to the third exemplary embodiment includes a connection portion 210 attached to the display area of the thin film transistor substrate 100 (see FIGS. 11 and 13), a short edge folded portion 220 enclosing a pair of short edge portion of the thin film transistor substrate 100 (see FIG. 13), and a long edge folded portion 230 enclosing a pair of long edge portions of the thin film transistor substrate 100 (see FIG. 13).

As seen in FIG. 13, the short edge folded portion 220 includes a short edge side surface folded portion 221 contacting the side surface of the short edge portion of the thin film transistor substrate 100 and a short edge bottom surface folded portion 222 contacting the neighboring bottom surface adjacent to the side surface of the short edge portion of the thin film transistor substrate 100.

Also, the long edge folded portion 230 includes a long edge side surface folded portion 231 contacting the side surface of the long edge portion of the thin film transistor substrate 100 and a long edge bottom surface folded portion 232 contacting the neighboring bottom surface adjacent to the side surface of the long edge portion of the thin film transistor substrate 100.

The short edge folded portion 220 and the long edge folded portion 230 simultaneously enclose a pair of short edge portions and long edge portions of the thin film transistor substrate 100 so that the bending of the organic light emitting diode (OLED) display due to the difference of the thermal expansion coefficient between the sealing substrate 200 made of the metal sheet and the supporting substrate of the thin film transistor substrate 100 made of glass may be further minimized. At this point, the short edge folded portion 220 and the long edge folded portion 230 overlap each other, thereby enclosing the corner of the thin film transistor substrate 100 through the overlap.

Also, as shown in FIG. 14, the portion where the short edge folded portion 220 and the long edge folded portion 230 overlap each other is removed so that the corner of the thin film transistor substrate 100 may be further strongly enclosed, thereby further minimizing the bending of the organic light emitting diode (OLED) display.

At this point, the corner 2 of the short edge folded portion 220 and the long edge folded portion 230 is chamfered so that the overlapping portion may be minimized when the short edge folded portion 220 and the long edge folded portion 230 contact each other.

Meanwhile, in the first to third exemplary embodiments, the thin film transistor substrate 100 contacting the folded portion of the sealing substrate is not separately processed. However, in the fourth exemplary embodiment, etching of the bottom surface of the thin film transistor substrate 100 to insert the folded portion of the sealing substrate is possible.

Next, the fourth exemplary embodiment will be described with reference to FIG. 15 to FIG. 17.

Figure 15:
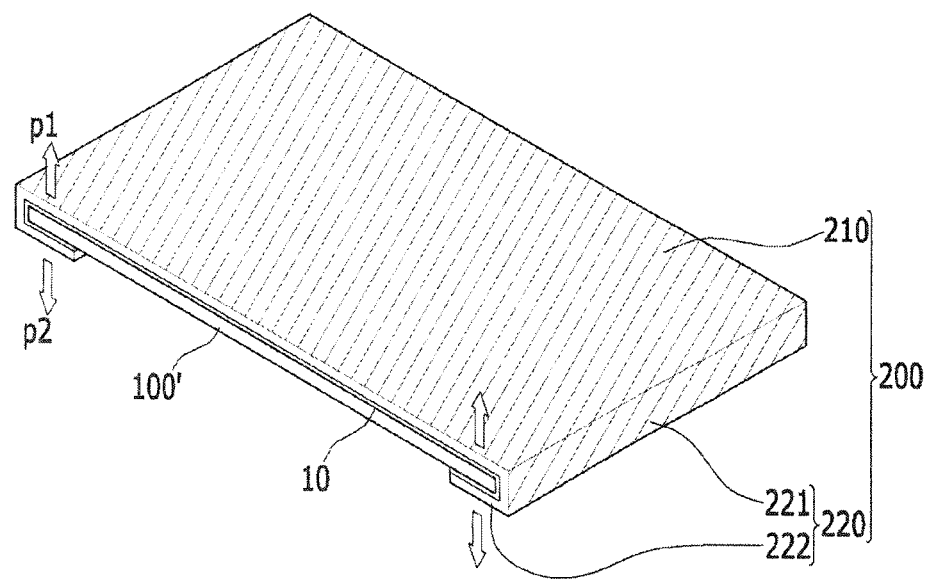
FIG. 15 is a perspective view of an organic light emitting diode (OLED) display according to a fourth exemplary embodiment of the invention.
Figure 16:
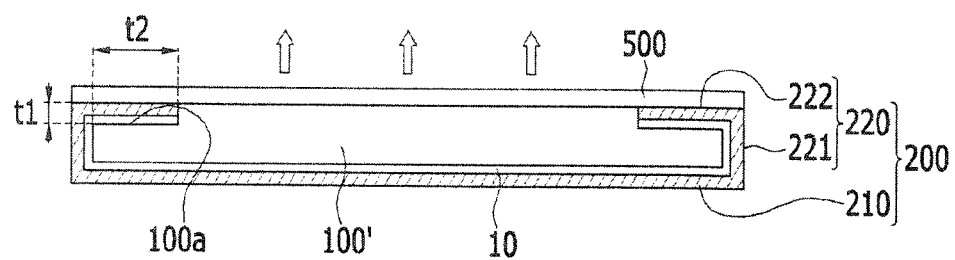
FIG. 16 is a cross-sectional view of an organic light emitting diode (OLED) display according to the fourth exemplary embodiment.

FIG. 15 is a perspective view of an organic light emitting diode (OLED) display according to a fourth exemplary embodiment of the invention, and FIG. 16 is a cross-sectional view of an organic light emitting diode (OLED) display according to the fourth exemplary embodiment.

The fourth exemplary embodiment shown in FIG. 15 and FIG. 16 is substantially equivalent to the first to third exemplary embodiments shown in FIG. 1 to FIG. 14 except for a bottom surface groove formed at a neighboring bottom surface adjacent to the side surface of an edge portion of the thin film transistor substrate, such that the overlapping described previously is omitted.

As shown in FIG. 15 and FIG. 16, a thin film transistor substrate 100' of an organic light emitting diode (OLED) display according to the fourth exemplary embodiment has a bottom surface groove, of which a neighboring bottom surface adjacent to the side surface of an edge portion of the thin film transistor substrate 100' is etched, and the bottom surface groove includes a short edge bottom surface groove 100a formed at a short edge portion of the thin film transistor substrate 100'.

As seen in FIG. 15 and FIG. 16, the sealing substrate 200 includes a connection portion 210 attached to the display area of the thin film transistor substrate 100' and the folded portion enclosing the side surface and the bottom surface groove of the edge portion of the thin film transistor substrate 100.

The folded portion includes a short edge folded portion 220 of a pair of short edge portions of the thin film transistor substrate 100'. The short edge folded portion 220 includes a short edge side surface folded portion 221 enclosing the side surface of the short edge portion of the thin film transistor substrate 100' and a short edge bottom surface folded portion 222 inserted into the short edge bottom surface groove 100a adjacent to the side surface of the short edge portion of the thin film transistor substrate 100'.

A depth t1 (see FIG. 16) of the short edge bottom surface groove 100a may be 5 to 20 μm, and a length t2 of the short edge bottom surface groove 100a may correspond to the length of the short edge bottom surface folded portion 222 of the sealing substrate 200.

A sealant 10 is interposed between the short edge folded portion 220 and the thin film transistor substrate 100'. At this point, the sealant 10 is interposed between the short edge bottom surface groove 100a and the short edge bottom surface folded portion 222. Accordingly, by the hardening of the sealant 10, the short edge side surface folded portion 221 and the short edge bottom surface folded portion 222 are adhered to the side surface of the short edge portion of the thin film transistor substrate 100' and the short edge bottom surface groove 100a, respectively.

As shown in FIG. 16, a polarizing plate 500 is attached to the outside surface of the short edge bottom surface folded portion 222 and the bottom surface of the thin film transistor substrate 100'. At this point, the short edge bottom surface folded portion 222 is inserted into the short edge bottom surface groove 100a so that the heights of the outside surface of the short edge bottom surface folded portion 222 and the bottom surface of the thin film transistor substrate 100' correspond to each other. Accordingly, the polarizing plate 500 may be flatly adhered to the bottom surface of the thin film transistor substrate 100' without a step such that leakage is not generated, and thereby deterioration of the display quality may be prevented.

A manufacturing method of an organic light emitting diode (OLED) display according to the fourth exemplary embodiment will be described with reference to FIGS. 15 to 17.

Figure 17:
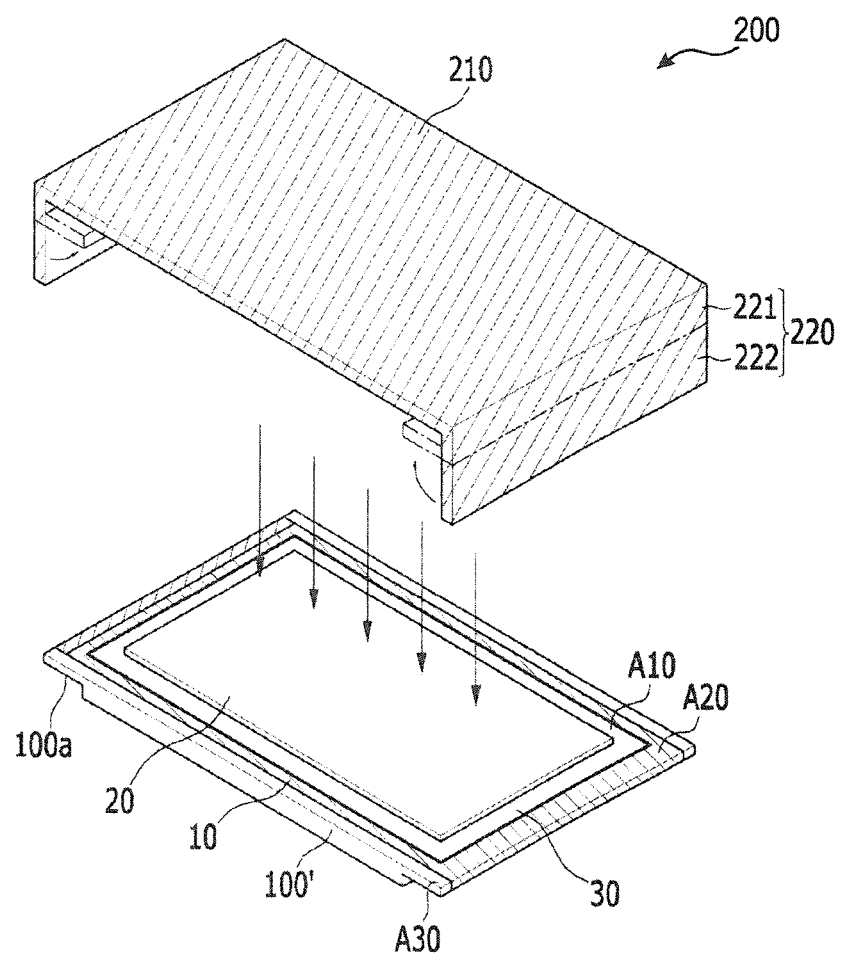
FIG. 17 is a view of a state in which a folded portion of a sealing substrate of an organic light emitting diode (OLED) display according to the fourth exemplary embodiment is folded, and then attached to a thin film transistor substrate.

FIG. 17 is a view of a state in which a folded portion of a sealing substrate of an organic light emitting diode (OLED) display according to the fourth exemplary embodiment is folded, and then attached to a thin film transistor substrate.

As shown in FIG. 17, a neighboring bottom surface adjacent to the side surface of the short edge portion of the thin film transistor substrate 100' including an organic light emitting element is etched to form a short edge bottom surface groove 100a.

Also, a sealant 10 is coated on the side surface and the short edge bottom surface groove 100a of the short edge portion of the thin film transistor substrate 100'.

Furthermore, a sealing substrate 200 (see FIGS. 15 and 16) is attached to the surface of the thin film transistor substrate 100'. Also, the short edge folded portion 220 of the sealing substrate 200 is folded so as to enclose the side surface and the short edge bottom surface groove 100a of the short edge portion of the thin film transistor substrate 100'. At this point, the short edge bottom surface folded portion 222 is inserted into the short edge bottom surface groove 100a so that the heights of the outside surface of the short edge bottom surface folded portion 222 and the bottom surface of the thin film transistor substrate 100' correspond so as to be flat.

Next, as shown in FIG. 15, by hardening the sealant 10, the short edge side surface folded portion 221 and the short edge bottom surface folded portion 222 are respectively adhered to the side surface and the short edge bottom surface groove 100a of the short edge portion of the thin film transistor substrate 100'. Accordingly, the short edge folded portion 220 pulls the short edge portion of the thin film transistor substrate in the lower direction p2 so that the short edge bottom surface folded portion 222 of the sealing substrate 200 pulls against the force with which the connection portion 210 of the sealing substrate 200 pulls the thin film transistor substrate 100' through a force in the opposite direction, thereby preventing the bending of the organic light emitting diode (OLED) display.

Next, as shown in FIG. 16, a polarizing plate 500 is attached to the outside surface of the short edge bottom surface folded portion 222 and the bottom surface of the thin film transistor substrate 100'. The outside surface of the short edge bottom surface folded portion 222 and the bottom surface of the thin film transistor substrate 100' are flat so as to not generate a step to the polarizing plate 500 so that light leakage is not generated, thereby preventing deterioration of the display quality.

Meanwhile, in the fourth exemplary embodiment, the short edge folded portion 220 is formed in the sealing substrate 200. However, in the fifth exemplary embodiment, forming of the long edge folded portion at the seal substrate is possible, as was the case in the second exemplary embodiment.

Next, the fifth exemplary embodiment will be described with reference to FIG. 18.

Figure 18:
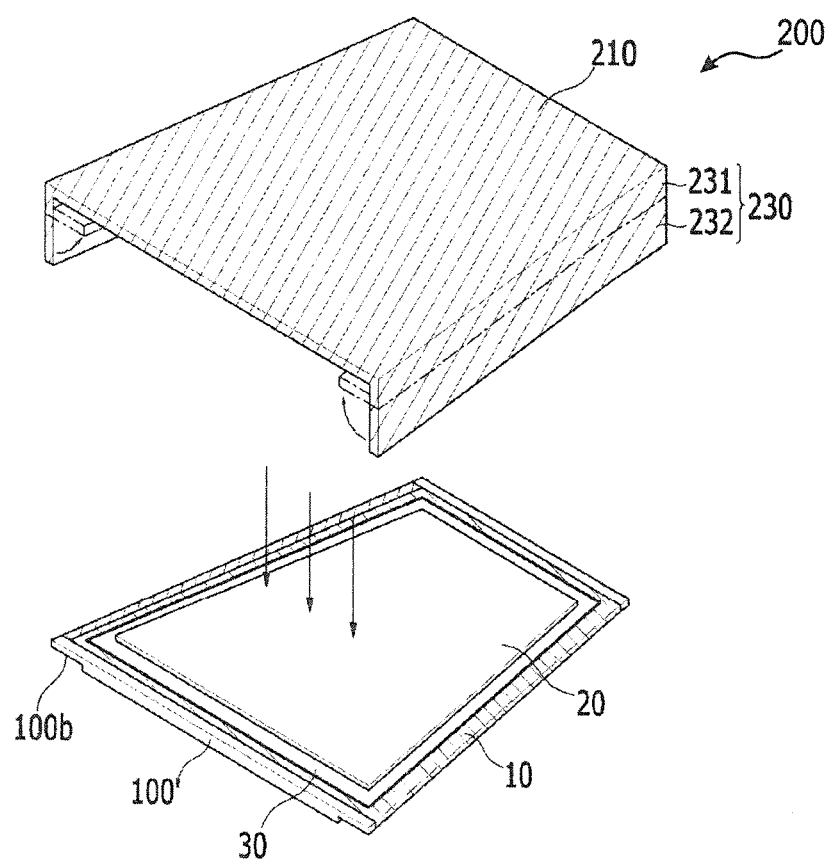
FIG. 18 is a view of a state in which a folded portion of a sealing substrate of an organic light emitting diode (OLED) display according to the first exemplary embodiment is folded, and then attached to a thin film transistor substrate.

FIG. 18 is a view of a state in which a folded portion of a sealing substrate of an organic light emitting diode (OLED) display according to the first exemplary embodiment is folded, and then attached to a thin film transistor substrate 100'.

The fifth exemplary embodiment shown in FIG. 18 is substantially equivalent to the fourth exemplary embodiment shown in FIG. 15 to FIG. 17 except for the long edge folded portion formed in the sealing substrate so that the overlapping description is omitted.

As shown in FIG. 18, a neighboring bottom surface adjacent to the side surface of the edge portion of the transistor substrate 100' of the organic light emitting diode (OLED) display according to the fifth exemplary embodiment has an etched bottom surface groove, and the bottom surface groove includes a long edge bottom surface groove 100b formed at the long edge portion of the thin film transistor substrate 100'.

The sealing substrate 200 includes the connection portion 210 attached to the display area of the thin film transistor substrate 100' and the folded portion enclosing the side surface and the bottom surface of the edge portion of the thin film transistor substrate 100'. The folded portion includes the long edge folded portion 230 enclosing a pair of long edge portions of the thin film transistor substrate 100'. The long edge folded portion 230 includes the long edge side surface folded portion 231 enclosing the side surface of the long edge portion of the thin film transistor substrate 100' and the long edge bottom surface folded portion 232 inserted into the short edge bottom surface groove 100*b* adjacent to the side surface of the long edge portion of the thin film transistor substrate 100'.

The sealant 10 is inserted between the long edge folded portion 230 and the thin film transistor substrate 100'. At this point, the sealant 10 is also inserted between the long edge bottom surface groove 100*b* and the long edge bottom surface folded portion 232. Accordingly, by the hardening of the sealant 10, the long edge side surface folded portion 231 and the long edge bottom surface folded portion 232 are respectively adhered to the side surface and the long edge bottom surface groove 100*b* of the long edge portion of the thin film transistor substrate 100'.

The polarizing plate 500 (referring to FIG. 16) may be attached to the outside surface of the long edge bottom surface folded portion 232 and the bottom surface of the thin film transistor substrate 100' of FIG. 18. At this point, the long edge bottom surface folded portion 232 is inserted into the long edge bottom surface groove 100*b* so that the heights of the outer surface of the long edge bottom surface folded portion 232 and the bottom surface of the thin film transistor substrate 100' correspond to each other. Accordingly, the polarizing plate 500 may be flatly attached to the bottom surface of the thin film transistor substrate 100' without a step so that light leakage is not generated, thereby preventing deterioration of the display quality.

The long edge folded portion 230 encloses a pair of long edge portions of the thin film transistor substrate 100' so that the long edge folded portion 230 pulls the long edge portion of the thin film transistor substrate 100' in the lower direction p2. As described above, the long edge bottom surface folded portion 232 of the sealing substrate 200 pulls against the force with which the connection portion 210 of the sealing substrate 200 pulls the thin film transistor substrate 100' in the upper direction p1 through a force of the opposite direction, thereby preventing the bending of the organic light emitting diode (OLED) display.

Meanwhile, in the fourth and fifth exemplary embodiments, only one of the short edge folded portion and the long edge folded portion is formed in the sealing substrate. However, as in the third exemplary embodiment, the short edge folded portion and the long edge folded portion may be formed in the sealing substrate. This is substantially equivalent to the description of the first to fifth exemplary embodiments so that repeated description is omitted.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
   a thin film transistor substrate including an organic light emitting element disposed on a top surface of the thin film transistor substrate and driven by the thin film transistor substrate to display images; and
   a one-piece sealing substrate attached to the thin film transistor substrate so as to seal the thin film transistor substrate;
   the sealing substrate covers the top surface of the thin film transistor substrate and has a folded portion enclosing a side surface and a bottom surface of an edge portion of the thin film transistor substrate, and exposing another side surface of the thin film transistor substrate.

2. The organic light emitting diode (OLED) display device of claim 1, wherein the folded portion includes a short edge folded portion enclosing a pair of spaced-apart short edge portions of the thin film transistor substrate.

3. The organic light emitting diode (OLED) display device of claim 1, wherein a sealant is interposed between the folded portion and the thin film transistor substrate.

4. The organic light emitting diode (OLED) display device of claim 1, wherein the long edge folded portion includes a long edge side surface folded portion contacting a side surface of the enclosed long edge portion of the thin film transistor substrate, and a long edge bottom surface folded portion contacting a neighboring bottom surface adjacent to the side surface of the enclosed long edge portion of the thin film transistor substrate.

5. The organic light emitting diode (OLED) display device of claim 1, wherein the bottom surface of the edge portion of the thin film transistor substrate includes a bottom surface groove having a portion adjacent to the side surface of the edge portion of the thin film transistor substrate which is etched, and the folded portion encloses the bottom surface groove.

6. The organic light emitting diode (OLED) display device of claim 1, wherein the sealing substrate includes a metal sheet.

7. The organic light emitting diode (OLED) display device of claim 1, wherein the folded portion includes a long edge folded portion enclosing a long edge portion of the thin film transistor substrate.

8. The organic light emitting diode (OLED) display device of claim 2, wherein the short edge folded portion includes a short edge side surface folded portion contacting a side surface of a short edge portion of the thin film transistor substrate and a short edge bottom surface folded portion contacting a neighboring bottom surface adjacent to the side surface of the short edge portion of the thin film transistor substrate.

9. The organic light emitting diode (OLED) display device of claim 3, wherein a filler is formed between the sealing substrate and the thin film transistor substrate.

10. The organic light emitting diode (OLED) display device of claim 5, wherein the folded portion includes a side surface folded portion enclosing the side surface of the edge portion of the thin film transistor substrate and a bottom surface folded portion inserted into a bottom surface groove of the edge portion of the thin film transistor substrate; and
    wherein a sealant is interposed between the bottom surface groove and the bottom surface folded portion.

11. The organic light emitting diode (OLED) display device of claim 9, wherein the folded portion includes a long edge folded portion enclosing a long edge portion of the thin film transistor substrate and a short edge folded portion enclosing a short edge portion of the thin film transistor substrate.

12. The organic light emitting diode (OLED) display device of claim 9, wherein a moisture absorbing member is formed between the sealant and the filler.

13. The organic light emitting diode (OLED) display device of claim 10, wherein heights of the outside surface of the bottom surface folded portion and the bottom surface of the thin film transistor substrate correspond to each other.

14. The organic light emitting diode (OLED) display device of claim 13, further comprising a polarizing plate simultaneously covering an outside surface of the bottom surface folded portion and a bottom surface of the thin film transistor substrate.

15. A method of manufacturing an organic light emitting diode (OLED) display device, comprising the steps of:
   coating a sealant on a side surface of an edge portion of a thin film transistor substrate including an organic light emitting element driven by the thin film transistor substrate to display imam and a neighboring bottom surface of the thin film transistor substrate that is adjacent to the side surface;
   adhering a sealing substrate to a surface of the thin film transistor substrate; and
   folded the edge portion of the sealing substrate to form a folded portion of the sealing substrate enclosing the side surface of the edge portion of the thin film transistor substrate and the neighboring bottom surface and exposing another side surface of the thin film transistor substrate.

16. The method of claim 15, wherein in the step of forming the folded portion of the sealing substrate, a short edge folded portion enclosing a pair of short edge portions of the thin film transistor substrate is formed.

17. The method of claim 15, wherein in the step of forming the folded portion of the sealing substrate, a long edge folded portion enclosing a pair of long edge portions of the thin film transistor substrate is formed.

18. The method of claim 15, further comprising the steps of:
   etching the neighboring bottom surface adjacent to the side surface of the edge portion of the thin film transistor substrate to form a bottom surface groove; and
   coating the sealant on the side surface of the edge portion of the thin film transistor substrate and on the bottom surface groove.

19. The method of claim 15, wherein the sealing substrate includes a metal sheet.

20. The method of claim 16, further comprising the step of hardening a sealant interposed between the short edge folded portion and the side surface of the edge portion of the thin film transistor substrate and the neighboring bottom surface.

21. The method of claim 17, further comprising the step of hardening a sealant interposed between the long edge folded portion and the side surface of the edge portion of the thin film transistor substrate and the neighboring bottom surface.

22. The method of claim 18, wherein the folded portion includes a side surface folded portion enclosing the side surface of the edge portion of the thin film transistor substrate and a bottom surface folded portion inserted into the bottom surface groove; and
   said method further comprising the step of hardening a sealant interposed between the side surface folded portion and the side surface of the edge portion of the thin film transistor substrate, and interposed between the bottom surface folded portion and the bottom surface groove.

23. The method of claim 19, wherein a length of a long edge portion of the sealing substrate is longer than a length of a long edge portion of the thin film transistor substrate.

24. The method of claim 22, wherein heights of the outside surface of the bottom surface folded portion and the bottom surface of the thin film transistor substrate correspond to each other.

25. The method of claim 24, further comprising the step of attaching a polarizing plate to the outside surface of the bottom surface folded portion and to the bottom surface of the thin film transistor substrate.

26. The method of claim 25, wherein a length of a short edge portion of the sealing substrate is longer than a length of a short edge portion of the thin film transistor substrate.

27. The method of claim 26, further comprising the step of removing a portion of the sealing substrate where a long edge folded portion of the sealing substrate and a short edge folded portion of the sealing substrate overlap each other.

28. The method of claim 26, further comprising the step of chamfering the corners of a long edge folded portion of the sealing substrate and a short edge folded portion of the sealing substrate.

* * * * *